(12) United States Patent
Keup et al.

(10) Patent No.: US 8,716,053 B2
(45) Date of Patent: May 6, 2014

(54) MOISTURE BARRIER FOR PHOTOVOLTAIC CELLS

(71) Applicant: E I du Pont de Nemours and Company, Wilmington, DE (US)

(72) Inventors: Kenneth C Keup, Newark, DE (US); Hoang V Tran, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/766,841

(22) Filed: Feb. 14, 2013

(65) Prior Publication Data

US 2013/0217167 A1 Aug. 22, 2013

Related U.S. Application Data

(60) Provisional application No. 61/599,645, filed on Feb. 16, 2012.

(51) Int. Cl.
*H01L 21/00* (2006.01)
*C03B 8/00* (2006.01)

(52) U.S. Cl.
USPC .............................................. 438/64; 65/17.2

(58) Field of Classification Search
None
See application file for complete search history.

(56) References Cited

U.S. PATENT DOCUMENTS

| | | | | |
|---|---|---|---|---|
| 5,068,208 | A | * | 11/1991 | Haun et al. ...................... 501/12 |
| 5,433,956 | A | * | 7/1995 | Patel ............................. 424/400 |
| 5,585,136 | A | * | 12/1996 | Barrow et al. ................ 427/2.24 |
| 6,506,499 | B1 | * | 1/2003 | Blohowiak et al. ........... 428/448 |
| 6,551,559 | B1 | * | 4/2003 | Cates et al. .................... 422/547 |
| 7,820,097 | B2 | | 10/2010 | Schroder et al. |
| 2007/0081246 | A1 | * | 4/2007 | Stuck et al. ................... 359/568 |
| 2007/0253668 | A1 | * | 11/2007 | Pita et al. ...................... 385/123 |
| 2009/0148711 | A1 | * | 6/2009 | Le Blanc et al. .............. 428/447 |
| 2009/0223551 | A1 | | 9/2009 | Reddy et al. |
| 2010/0252108 | A1 | * | 10/2010 | Singh et al. ................... 136/261 |

FOREIGN PATENT DOCUMENTS

WO 2011/028513 A2 3/2011

* cited by examiner

*Primary Examiner* — Scott B Geyer

(57) ABSTRACT

A process for sealing a multilayer article against environmental degradation. The article comprises a photoactive layer disposed on a length of flexible substrate and is sealed by applying a sol-gel layer to the outermost layer of the article and curing the sol-gel layer into a flexible, glass protective-coating. The multilayer article can be a photovoltaic device.

9 Claims, 2 Drawing Sheets

MOISTURE BARRIER FOR PHOTOVOLTAIC CELLS

BACKGROUND OF THE INVENTION

The invention pertains to a process for sealing a multilayer article against environmental degradation and more particularly, to a process for sealing a multilayer article such as a multilayer photovoltaic cell comprising a photoactive layer disposed on a length of flexible substrate.

Photovoltaic cells are made by depositing various layers of materials on a suitable substrate which can be rigid (e.g., glass or a silicon wafer) or flexible (e.g., a thin metal or polymer sheet). U.S. Patent Publication No. US 2009/0223551 A1, for example, describes a process for fabricating a solar cell, i.e., a photovoltaic device, in a continuous roll to roll process wherein the substrate comprises a length of flexible foil. A set of multiple layers comprising the photovoltaic device are formed on a section of the substrate, i.e., a bare flexible substrate is supplied, and a complete solar cell device is realized in a continuous process. Once completed, the flexible solar cell can be re-rolled onto a take-up spool.

In the manufacture of flexible thin film $Cu(In,Ga)Se_2$ (CIGS) solar cells, for example, one of the most important aspects is effectively sealing the completed multi-layer device against moisture degradation. There remains a need for a method to produce a barrier layer, i.e., a flexible protective top sheet, on a flexible multi-layer device that has the flexibility of the device, surface properties to resist or prevent moisture penetration, and can be used in a roll-to-roll process of the type used for fabricating CIGS and the like photovoltaic cells.

SUMMARY OF THE INVENTION

In one aspect, the present invention pertains to a process for sealing a multilayer article comprising: (a) providing a multilayer article to be sealed wherein said article comprises a photoactive layer disposed on a length of flexible substrate; (b) applying a sol-gel layer to the outermost layer of said article; and (c) heating the sol-gel layer with one or more pulses of radiation to cure the sol-gel layer into a glass layer without substantially affecting other layers, wherein the radiation is from a radiation source having emission spectrum in the range of from 200 to 1000 nm and each of the one or more pulses has a duration in the range of 1 to 1000 microseconds.

In another aspect, the present invention pertains to a process for making a photovoltaic device with improved resistance to moisture degradation comprising: 1) providing a photovoltaic device comprising (i) a substrate comprising a length of flexible material, and (ii) a set of multiple layers comprising a photovoltaic device disposed on a section of said substrate wherein the top layer of the set of multiple layers is a film of $Al_2O_3$; 2) continuously moving the photovoltaic device past at least one sol-gel deposition source; 3) depositing a sol-gel layer onto the top layer of said photovoltaic device; and 4) heating the sol-gel layer with radiation to cure the sol-gel layer into a glass layer without substantially affecting other layers of the device, wherein the radiation is from a radiation source having emission spectrum in the range of from 200 nm to 1000 nm and each of the one or more pulses has a duration in the range of 1 to 1000 microseconds.

Preferably, the photoactive layer comprises CIGS, CIS or CZTS-Se and the photovoltaic device is CIGS, CIS or CZTS-Se device.

In one embodiment, the glass layer is a borosilicate glass layer comprising $SiO_2$, $Al_2O_3$, $Na_2O$, and $B_2O_3$, and optionally one or more oxides selected from the group consisting of MgO, $K_2O$, CaO, PbO, $GeO_2$, $SnO_2$, $Sb_2O_2$ and $Bi_2O_3$.

In another embodiment, outermost layer is a film of $Al_2O_3$.

In yet another embodiment, the glass layer formed in the present process has a generally uniform thickness in the range of from about 50 nm to about 2000 nm.

The present process imparts a flexible glass layer onto the outermost layer of a multilayer article, which includes a photovoltaic device, and thereby seals and protects the article/device against physical damage and moisture degradation.

DETAILED DESCRIPTION OF THE INVENTION

Figure 1:
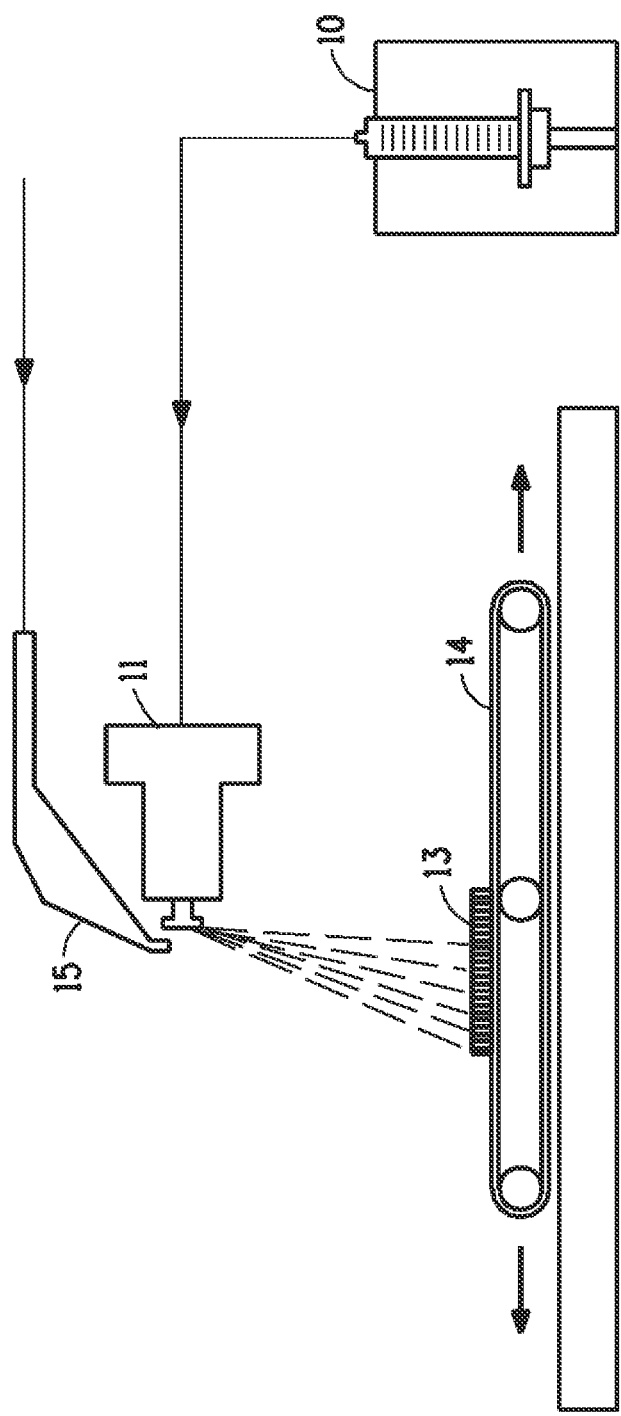
FIG. 1 is a simplified schematic diagram of a spray apparatus for applying a sol-gel layer onto a moving substrate.

The multilayer article prescribed in the present invention comprises a plurality of layers. The bottom layer is the substrate and disposed on the substrate are one or more other layers collectively forming the multilayer article. The outermost (or 'top') layer of the multilayer article refers to the layer furthest from the substrate prior to application of the glass layer. At least one of the layers disposed on the substrate is a photoactive layer.

One type of multilayer article comprising a photoactive layer is a photovoltaic device. The multiple layers of the photovoltaic device comprise the functional layers necessary in a working environment to convert light into electricity. Herein, the term 'photovoltaic device' and 'solar cell' are used interchangeably.

The substrate is flexible and may comprise any suitable material such as, for example, a metal foil (for example stainless steel) or a polymer such as, for example, a polyimide, a polyamide, a polyethersulfone, a polyetherimide, polyethylene terephthalate (PET), polypropylene terephthalate (PTT) and polytheylene naphthalate (PEN). By flexible it is meant capable of bending easily without breaking.

A continuous roll to roll process for fabrication of multilayer thin film solar cells on flexible substrates is described, for example, in U.S. Patent Application Publication No. 2009/0223551, the teachings of which are incorporated herein by reference in their entirety.

The main thin film solar technologies, that is to say the materials comprising the photoactive layer, include amorphous silicon, Copper-Indium-Selenide (CIS), Copper Indium Gallium Selenide (CIGS), and Cadmium Telluride (CdTe). CZTS-Se based solar cells are known and are analogous to CIGS solar cells except that CIGS is replaced by CZTS-Se, where "CZTS-Se" encompass all possible combinations of $Cu_2ZnSn(S,Se)_4$, including $Cu_2ZnSnS_4$, $Cu_2ZnSnSe_4$, and $Cu_2ZnSnS_xSe_{(4-x)}$, where $0 \leq x \leq 4$. The present process is particularly well suited for sealing multilayer articles, such as solar cells, comprising CIGS.

For long term operation of photovoltaic devices at high efficiencies, it is critical to protect them against environmental degradation, most notably moisture degradation. Modeling studies have indicated that the moisture resistance of photovoltaic CIGS devices with an outermost layer of $Al_2O_3$ thin film deposited by atomic layer deposition (ALD) can be increased in moisture resistance by encapsulation with a flexible glass layer such as a glass layer formed according to the process of this invention. Those modeling studies predict that sealing the device with a glass layer as prescribed can achieve a water vapor permeation or transmission rate (WVTR) of between $10^{-4}$ g-$H_2O$/m$^2$/day and $10^{-6}$ g-$H_2O$/m$^2$/day which equates to a very satisfactory device lifetime of greater than 20 years. The $Al_2O_3$ layer serves as a vapor barrier for the cell and the flexible glass layer, such as a borosilicate glass layer described herein, protects the device against physical damage and aids the $Al_2O_3$ layer as a further barrier against water penetration.

According to the process of this invention, a glass layer, such as a borosilicate glass layer, is formed, in-place, by curing of a sol-gel layer deposited on the multilayer article. The term sol-gel is used in the conventional sense and refers to a solution (including a dried, uncured solution) of glass-forming chemical precursors. In a preferred embodiment, the sol-gel is a borosilicate sol-gel comprising precursor species which form a borosilicate glass layer upon curing. The borosilicate glass layer thus formed comprises $SiO_2$, $Al_2O_3$, $Na_2O$ and $B_2O_3$, and optionally one or more oxides selected from the group consisting of MgO, $K_2O$, CaO, PbO, $GeO_2$, $SnO_2$, $Sb_2O_2$ and $Bi_2O_3$. The composition of the sol-gel solution can be adjusted for specific applications to optimize the characteristics of the glass (such as flexibility, energy transmission) formed from the cured sol-gel.

A preferred borosilicate sol-gel solution comprises, for example, a soluble form of silicon, (such as, for example, silicon tetraacetate, silicon tetrapropionate, bis(acetylacetonato)bis(acetato)silicon, bis(2-methoxyethoxy)bis(acetato) silicon, bis(acetylacetonato)bis(ethoxy)silicon, tetramethylorthosilicate, tetraethylorthosilicate, tetraisopropylorthosilicate, and the like and any combination thereof), dissolved in a minimum amount of a $C_1$-$C_{10}$ alcohol (such as, for example, methanol, ethanol, 1-propanol, 2-propanol, 1-butanol, 2-butanol, isomers of 1-butanol, 1-pentanol, 2-pentanol, 3-pentanol, isomers of pentanol, 1-hexanol, 2-hexanol, 3-hexanol, isomers of hexanol, 1-heptanol, isomers of heptanol, 1-octanol, isomers of octanol, 1-nonanol, isomers of nonanol, 1-decanol, isomers of decanol, ethylene glycol, 1-methoxyethanol, 1-ethoxyethanol, or mixtures thereof); a trialkylborate (such as, for example, trimethylborate, triethylborate, tripropylborate, trimethoxyboroxine, and the like and any combination thereof); a sodium salt (such as, for example, sodium acetate, sodium propionate, sodium silicate, sodium alkoxides, and the like and any combination thereof); an aluminum compound (such as, for example, tris(acetylacetonatio)aluminum, aluminum methoxide, aluminum ethoxide, aluminum isopropoxide, aluminum n-propoxide, or mixtures thereof); and optionally a potassium salt (such as, for example, potassium acetate, potassium propionate, potassium methoxide, potassium ethoxide, potassium isopropoxide and the like and any combination thereof).

The sol-gel formulation can be filtered prior to its application to the outermost (or top) layer of the article to be sealed. In some embodiments, the composition of the glass precursors in the sol-gel formulation is calculated to give a final borosilicate glass composition containing 70-95 wt % $SO_2$, 5-15 wt % $B_2O_3$, 0-20 wt % $Na_2O$, and 0-10 wt % $Al_2O_3$ based on the total weight of composition.

In one embodiment, the sol-gel composition is prepared by dissolving a silicon oxide precursor (tetraethylorthosilicate) in a minimum amount of 1-butanol, water, and acetic acid, with stirring. To this solution, an aluminum oxide precursor (tris(acetylacetonato)aluminum), a boron oxide precursor (triethyl borate), and a sodium oxide precursor (sodium propionate) are added. Once the precursors are dissolved, more solvent is added to obtain the desired concentration. Preferred precursors for MgO, $K_2O$, CaO, PbO, $GeO_2$, $SnO_2$, $Sb_2O_2$ and $Bi_2O_3$ include the respective acetates: potassium acetate, calcium acetate, lead acetate, germanium acetate, tin acetate, antimony acetate, and bismuth acetate. Silicon tetraacetate and aluminum alkoxide (such as, for example aluminum isopropoxide) can also be used to prepare the sol-gel compositions. Optionally, borosilicate glass nanoparticles can be added to the sol-gel composition.

The sol-gel solution can be applied to the outermost (also referred to as 'top') layer of a multilayer article by spray application. The application of sol-gel according to one embodiment of the present process is depicted in FIG. 1. Referring to FIG. 1, a syringe pump 10 meters a precise volume of sol-gel solution to a sonicating head 11 creating a spray of sol-gel solution which is guided by airflow from spray nozzle 15 to the surface of a multilayer photovoltaic device 13 passing beneath the head on a continuously moving belt 14, thereby depositing a uniform layer of sol-gel on the outermost layer of the device.

The sol-gel layer must be cured to convert it to a glass layer. Curing can be accomplished with heat and a temperature of about 500° C. is normally required, although curing may be possible at a temperature anywhere in the range of about 300° C. to 800° C. Temperatures approaching or in excess of 250° C. will damage a typical photovoltaic device or a multilayer article comprising a photoactive layer and accordingly the present process prescribes heating and curing of the sol-gel layer without substantially affecting (damaging) the article being sealed and in particular without damaging the photoactive layer or photovoltaic device. The sol-gel layer is selectively heated so that the local temperature is sufficient to cure the sol-gel, but other layers, especially heat-sensitive layers, remain cool(er) and undamaged. Such selective heating can be accomplished with pulsed radiation, which term refers to bursts of energy from a radiation source applied for short durations, usually less than a second and more typically less than a millisecond. Pulsed radiation, also sometimes referred to in the art as "photonic curing", is described for example in U.S. Pat. No. 7,820,097, the teachings of which are incorporated herein by reference in theft entirety.

Photonic curing units are commercially available and include, for example, a PulseForge™ 3300 from NovaCentrix™ (Austin, Tex., USA). The PulseForge 3300 can cure a sol-gel layer by pulsing with a radiation source having an emission spectrum of from 200 nm to 1000 nm applied for a period of from 1 to 1000 microseconds without substantially affecting or damaging the underlying layers. Pulse duration and energy waveform are adjusted as required to achieve high curing temperatures in the sol-gel layer to form the glass layer while avoiding excessive heating of underlying layers, such as a CIGS layer and other heat-sensitive layers. In a continuous process mode, the pulsed radiation can easily be directed over entire width of the article being cured as it moves, for example, on a roll-to-roll web handling system.

Figure 2:
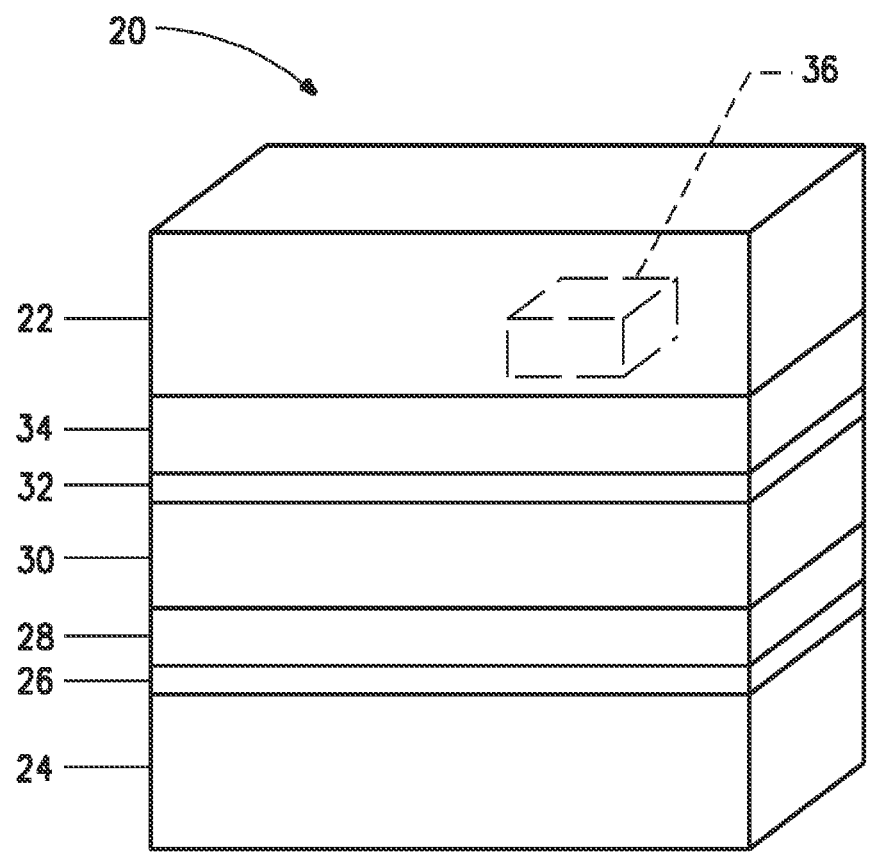
FIG. 2 is a cross sectional view of a typical multi-layer photovoltaic cell having a borosilicate glass layer disposed as the outermost layer.

An example of a sealed, multilayer photovoltaic device is depicted in FIG. 2. Referring now to FIG. 2, a cross sectional view of a typical multi-layer photovoltaic cell 20 is shown having a borosilicate glass layer 22 disposed as a protective layer. As shown, there is a flexible substrate base layer of metal foil 24; a glass intermediate layer 26; a molybdenum layer 28; a CIGS photovoltaic layer 30, a buffer layer 32; an indium tin oxide (ITO) transparent conductive oxide layer 34; and, a silver line 36 on top of the transparent conductive oxide layer 34, within the protective environment of the glass coating layer 22.

The glass layer, and in particular a borosilicate glass layer, typically has a thickness in the range of about 50 nm to 2000 nm. However, the thickness can be any suitable thickness so long as flexibility of the article is maintained. A preferred glass layer thickness is about 500 nm.

A borosilicate glass layer applied according to the present process remains flexible after curing and typically comprises greater than 70 wt % silica; less than 10 wt % alumina; 5-15 wt % of a boron oxide; and less than 20 wt % of oxides of sodium and/or potassium. In one embodiment, the cured glass layer comprises about 81 wt % $SiO_2$, about 13 wt % $B_2O_3$, about 4 wt % $Na_2O$, and about 2 wt % $Al_2O_3$ based on the total weight of the glass.

As noted herein before, coating or encapsulation of CIGS and other multilayer photovoltaic devices with a borosilicate glass layer according to the process of the present invention can provide a water vapor permeation or transmission rate (WVTR) of between $10^{-4}$ g $H_2O/m^2$/day and $10^{-6}$ g-$H_2O/m^2$/day, which modeling studies indicate corresponds to a greater than 20-year device lifetime.

It is understood that the embodiments described herein disclose only illustrative but not exhaustive examples of the invention set forth.

EXAMPLES

The borosilicate sol-gel precursor formulation used in these examples was prepared as follows. Tetraethylorthosilicate, 2.6047 g (12.50 mmol, >99.0% purity was dissolved in 10 mL of 1-butanol. To this solution was added 4 mL of glacial acetic acid (>99.7% purity). The solution was then refluxed at 118° C. for 2 h. Upon reflux completion and in the following order of addition, 0.0561 g (0.58 mmol) of sodium propionate (>99% purity); 0.1151 g (0.36 mmol) of tris(acetylacetonato) aluminium (>99% purity); and 0.5054 g (3.46 mmol) of triethylborate (99% purity) were added to the solution at room temperature with stirring in between additions. The solution was then stirred until clear and 1-butanol was added until the total volume of 25 mL was achieved. The solution, referred to as the borosilicate sol-gel precursor formulation, was filtered prior to use using a 0.45 micron PTFE filter. Reagents were obtained from Sigma Aldrich (St. Louis, Mo., USA) except for glacial acetic acid which was obtained from EMD Millipore (Billerica, Mass., USA).

Example 1

The multilayer article treated in this example was a 7 mil thick PET substrate (DuPont Teijin Films ST504) coated with 25 nm $Al_2O_3$ layer which was prepared according to WO2011/028513A2 and diced into 10 by 10 cm squares. (A photoactive layer was omitted for convenience to illustrate the coating and curing aspect of the process.)

The outermost layer of the article (the $Al_2O_3$ layer in this case) was spray-coated with the borosilicate sol-gel precursor formulation using a sonicating head (Sono-Tek Atomizer) with a nitrogen blow down. The article passed under the spray head on a custom-built stage. The stage speed and solution delivery rate were controlled to deposit the amount of sol-gel necessary to form a cured glass layer of 400-500 nm thickness. Samples were allowed to air dry in a ventilated enclosure before being dried in an oven at 100° C. for 2 minutes to remove the remaining solvent.

The sol-gel layer was then heated and cured by exposure to five 500 microsecond pulses of a broad wavelength radiation between 200 nm and 1000 nm using a PulseForge 3300. The dose was about 3 J/cm².

The sol-gel layer of example 1 was analyzed before and after curing by standard ESCA (electron spectroscopy for chemical analysis) methods to determine the chemical composition. Results for the cured and uncured sample are summarized in Table 1. As an indication of curing, the carbon to silicon ratio (C/Si) in the cured sample is less than the uncured sample because the carbon from the sol-gel is driven off during the curing process as the glass is formed.

Example 2

This example repeated the procedure of example 1 except that the sol-gel solution was applied directly to the PET substrate. The sol-gel layer of example 2 was analyzed by ESCA before and after curing and the results for the cured and uncured sample are summarized in Table 1.

Example 3

This example repeated the procedure of example 1 except that the sol-gel solution was applied directly a 2 mil thick Kapton substrate (DuPont Kapton HN). The sol-gel layer of example 3 was analyzed by ESCA before and after curing and the results for the cured and uncured sample are summarized in Table 1.

Example 4

This example repeated the procedure of example 1 except that the sol-gel solution was applied directly to a 2 mil thick stainless steel substrate (stainless steel 430, ATI Allegheny Ludlum). The sol-gel layer of example 4 was analyzed by ESCA before and after curing and the results for the cured and uncured sample are summarized in Table 1. As an indication of curing, the carbon to silicon ratio (C/Si) in the cured sample is less than the uncured sample because the carbon from the sol-gel is driven off during the curing process as the glass is formed.

TABLE 1

ESCA Analysis Of Glass Coatings

| Sample | Atom Percent Excluding Hydrogen | | | | | | | | C/Si |
|---|---|---|---|---|---|---|---|---|---|
| | C | O | N | B | Si | Na | Al | Other | |
| Example 1 (uncured) | 17.9 | 54.0 | ND | 3.4 | 19.3 | 0.4 | 5.0 | | 0.93 |
| Example 1 (cured) | 15.1 | 57.2 | ND | 3.2 | 19.4 | 0.7 | 4.4 | | 0.78 |
| Example 2 (uncured) | 14.9 | 57.2 | 0.2 | 7.1 | 19.4 | 0.9 | 0.4 | | 0.77 |
| Example 2 (cured) | 14.1 | 59.1 | 0.2 | 3.6 | 21.8 | 0.7 | 0.5 | | 0.65 |
| Example 3 (uncured) | 20.1 | 55.7 | 0.6 | 2.2 | 20.6 | 0.5 | 0.4 | | 0.98 |
| Example 3 (cured) | 16.7 | 57.0 | 0.3 | 2.8 | 22.1 | 0.7 | 0.5 | | 0.76 |
| Example 4 (uncured) | 24.1 | 52.1 | 0.2 | 0.8 | 21.0 | 1.0 | 0.6 | 0.2 (Fe) | 1.15 |
| Example 4 (cured) | 16.9 | 56.6 | ND | 1.1 | 23.6 | 1.1 | 0.7 | 0.1 (Fe) | 0.72 |

ND = Not Detected or Below Detection Limits of <0.1 Atom %

What is claimed is:
1. A process for sealing a multilayer article comprising:
(a) providing a multilayer article to be sealed wherein said article comprises a photoactive layer disposed on a length of flexible substrate;

(b) applying a sol-gel layer to the outermost layer of said article; and (c) heating the sol-gel layer with one or more pulses of radiation to cure the sol-gel layer into a glass layer without substantially affecting other layers, wherein the radiation is from a radiation source having emission spectrum in the range of from 200 to 1000 nm and each of the one or more pulses has a duration in the range of 1 to 1000 microseconds.

2. The process of claim 1 wherein i) said photoactive layer comprises CIGS, CIS or CZTS-Se, and ii) said glass layer is a borosilicate glass layer comprising $SiO_2$, $Al_2O_3$, $Na_2O$, and $B_2O_3$, and optionally one or more oxides selected from the group consisting of MgO, $K_2O$, CaO, PbO, $GeO_2$, $SnO_2$, $Sb_2O_2$ and $Bi_2O_3$.

3. The process of claim 1 wherein said glass layer has a generally uniform thickness in the range of from about 50 nm to about 2000 nm.

4. The process of claim 1 wherein the sol-gel layer is applied by spraying.

5. The process of claim 1 wherein the outermost layer is a film of $Al_2O_3$.

6. A process for making a photovoltaic device with improved resistance to moisture degradation comprising:

1) providing a photovoltaic device comprising (i) a substrate comprising a length of flexible material, and (ii) a set of multiple layers comprising a photovoltaic device disposed on a section of said substrate wherein the top layer of the set of multiple layers is a film of $Al_2O_3$;

2) continuously moving the photovoltaic device past at least one sol-gel deposition source;

3) depositing a sol-gel layer onto the top layer of said photovoltaic device; and 4) heating the sol-gel layer with radiation to cure the sol-gel layer into a glass layer without substantially affecting other layers of the device, wherein the radiation is from a radiation source having emission spectrum in the range of from 200 nm to 1000 nm and each of the one or more pulses has a duration in the range of 1 to 1000 microseconds.

7. The process of claim 6 wherein i) said photovoltaic device is selected from the group of CIGS, CIS and CZTS-Se devices and ii) said glass layer is a borosilicate glass layer comprising $SiO_2$, $Al_2O_3$, $Na_2O$, and $B_2O_3$, and optionally one or more oxides selected from the group consisting of MgO, $K_2O$, CaO, PbO, $GeO_2$, $SnO_2$, $Sb_2O_2$ and $Bi_2O_3$.

8. The process of claim 6 wherein said glass layer has a generally uniform thickness of from 50 nm to 2000 nm.

9. The process of claim 6 wherein the sol-gel layer is applied by spraying.

* * * * *